(12) United States Patent
Honjo (10) Patent No.: US 7,649,144 B2
(45) Date of Patent: Jan. 19, 2010

(54) CONNECTION STRUCTURE BETWEEN WIRED CIRCUIT BOARDS

(75) Inventor: Mitsuru Honjo, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/230,037

(22) Filed: Aug. 22, 2008

(65) Prior Publication Data
US 2009/0061660 A1    Mar. 5, 2009

Related U.S. Application Data

(60) Provisional application No. 60/960,580, filed on Oct. 4, 2007.

(30) Foreign Application Priority Data
Aug. 27, 2007    (JP)    ............................. 2007-219994

(51) Int. Cl.
*H05K 1/00* (2006.01)
(52) U.S. Cl. .................................................... 174/254
(58) Field of Classification Search ................ 174/254; 361/749–752
See application file for complete search history.

(56) References Cited

U.S. PATENT DOCUMENTS 6,399,899 B1    6/2002    Ohkawa et al.
6,943,302 B2 *    9/2005    Kageyama et al. .......... 174/254
7,119,285 B2 *    10/2006    Kim et al. ................... 174/254
7,348,492 B1 *    3/2008    Kawai et al. ................ 174/254

FOREIGN PATENT DOCUMENTS

JP    2001-209918    8/2001

\* cited by examiner

*Primary Examiner*—Briggitte R Hammond
(74) *Attorney, Agent, or Firm*—Jean C. Edwards, Esq.; Akerman Senterfitt (57) ABSTRACT

The connection structure between wired circuit boards connects a first wired circuit board and a second wired circuit board. The first wired circuit board includes a metal supporting layer, a first insulating layer formed on the metal supporting layer, and a first conductive pattern formed on the first insulating layer and having a first terminal portion. The metal supporting layer is arranged so as not to be opposed to the first terminal portion in a thickness direction. The first terminal portion and the first insulating layer opposed to the first terminal portion in a thickness direction are folded back into a curved shape. The second wired circuit board includes a second insulating layer, and a second conductive pattern formed on the second insulating layer and having a second terminal portion. The first terminal portion and the second terminal portion are electrically connected to each other.

3 Claims, 5 Drawing Sheets

CONNECTION STRUCTURE BETWEEN WIRED CIRCUIT BOARDS

CROSS-REFERENCE TO RELATED APPLICATIONS

This patent application claims the benefit of U.S. Provisional Application No. 60/960,580, filed on Oct. 4, 2007, and claims priority from Japanese Patent Application No. 2007-219994, filed on Aug. 27, 2007, the contents of which are herein incorporated by reference in their entirety.

BACKGROUND OF THE INVENTION

1. Field of the Invention

The present invention relates to a connection structure between wired circuit boards.

2. Description of Related Art

Wired circuit boards used in electronic/electric equipment or the like are typically formed with terminal portions for connection to external terminals.

As such terminal portions, so-called flying leads in which terminals are formed not only on one side of a conductive pattern but also on both sides of the conductive pattern, have been prevalent in recent years to be adapted for use in highly-densified and more miniaturized electronic/electric equipment, more specifically, for connection to fine-pitched external terminals.

For example, in a suspension board with circuit used in a hard disk drive, it has been known to form terminal portions as flying leads. Such terminal portions are connected to external terminals by, for example, applying ultrasonic vibrations by means of a bonding tool or the like (cf. Japanese Unexamined Patent Publication No. 2001-209918).

SUMMARY OF THE INVENTION

However, since the terminal portions formed as flying leads are low in mechanical strength, it may be difficult to fully achieve connection reliability with external terminals.

In addition, in the case where terminal portions and external terminals are connected to each other using molten metal, such as solder balls, the terminal portions and the external terminals overlap each other to degrade visibility. As a result, alignment between the connecting portions becomes difficult, which may in turn degrade connection reliability.

It is therefore an object of the present invention to provide a connection structure between wired circuit boards which can improve connection reliability between a first terminal portion and a second terminal portion with a simple structure.

The connection structure between wired circuit boards according to the present invention connects a first wired circuit board and a second wired circuit board, the first wired circuit board including a metal supporting layer; a first insulating layer formed on the metal supporting layer; and a first conductive pattern formed on the first insulating layer and having a first terminal portion, wherein the metal supporting layer is arranged so as not to be opposed to the first terminal portion in a thickness direction, and the first terminal portion and the first insulating layer opposed to the first terminal portion in a thickness direction are folded back into a curved shape, the second wired circuit board including a second insulating layer; and a second conductive pattern formed on the second insulating layer and having a second terminal portion, wherein the first terminal portion and the second terminal portion are electrically connected to each other.

In the connection structure between wired circuit boards, the first terminal portion is folded back into a curved shape, which can ensure good visibility in connection between the first terminal portion and the second terminal portion.

In the connection structure between wired circuit boards, the first conductive pattern is supported on the first insulating layer, which can reinforce mechanical strength in the first conductive pattern.

The first terminal portion is not supported on the metal supporting layer, which can reliably secure the curved shape in the first terminal portion.

Further, in the connection structure between wired circuit boards, even when a restoring force is exerted on the first terminal portion thus folded back into the curved shape, the restoring force acts so that the first terminal portion moves in a direction to come into pressure contact with the second terminal portion. Therefore, even in such case, the connection reliability between the first terminal portion and the second terminal portion can be improved.

As a result, the connection structure between wired circuit boards according to the present invention can improve connection reliability between the first terminal portion and the second terminal portion.

In the connection structure between wired circuit boards according to the present invention, it is preferable that the first terminal portion and the second terminal portion are connected to each other via a molten metal.

The connection structure between wired circuit boards according to the present invention has high connection reliability, and therefore, can be suitably used for a suspension board with circuit.

DETAILED DESCRIPTION OF PREFERRED EMBODIMENTS

Figure 1:
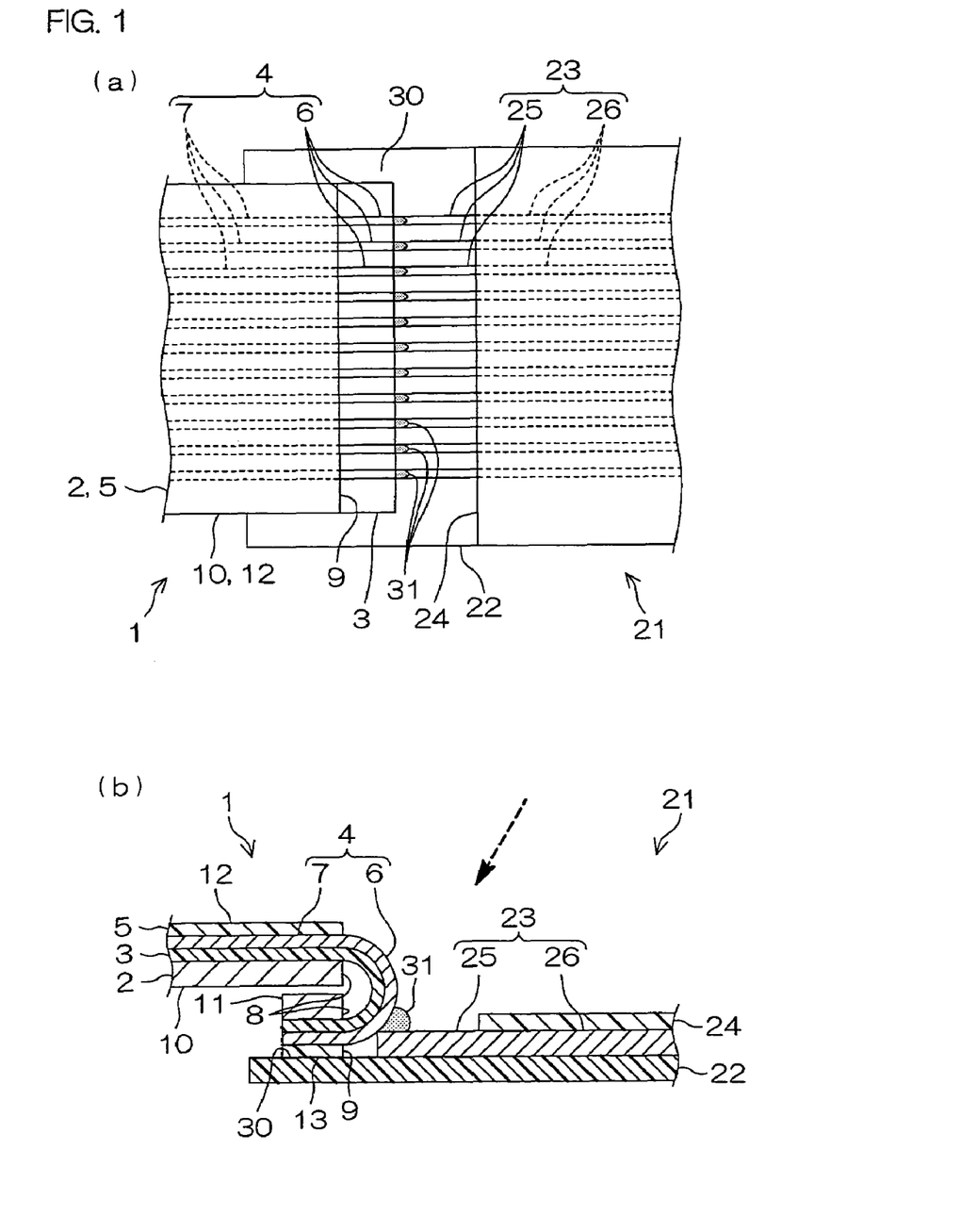
FIG. 1 is an enlarged view showing a main portion of one embodiment of a connection structure between wired circuit boards according to the present invention,
(a) showing a plan view, and
(b) showing a sectional view along the lengthwise direction thereof.
Figure 2:
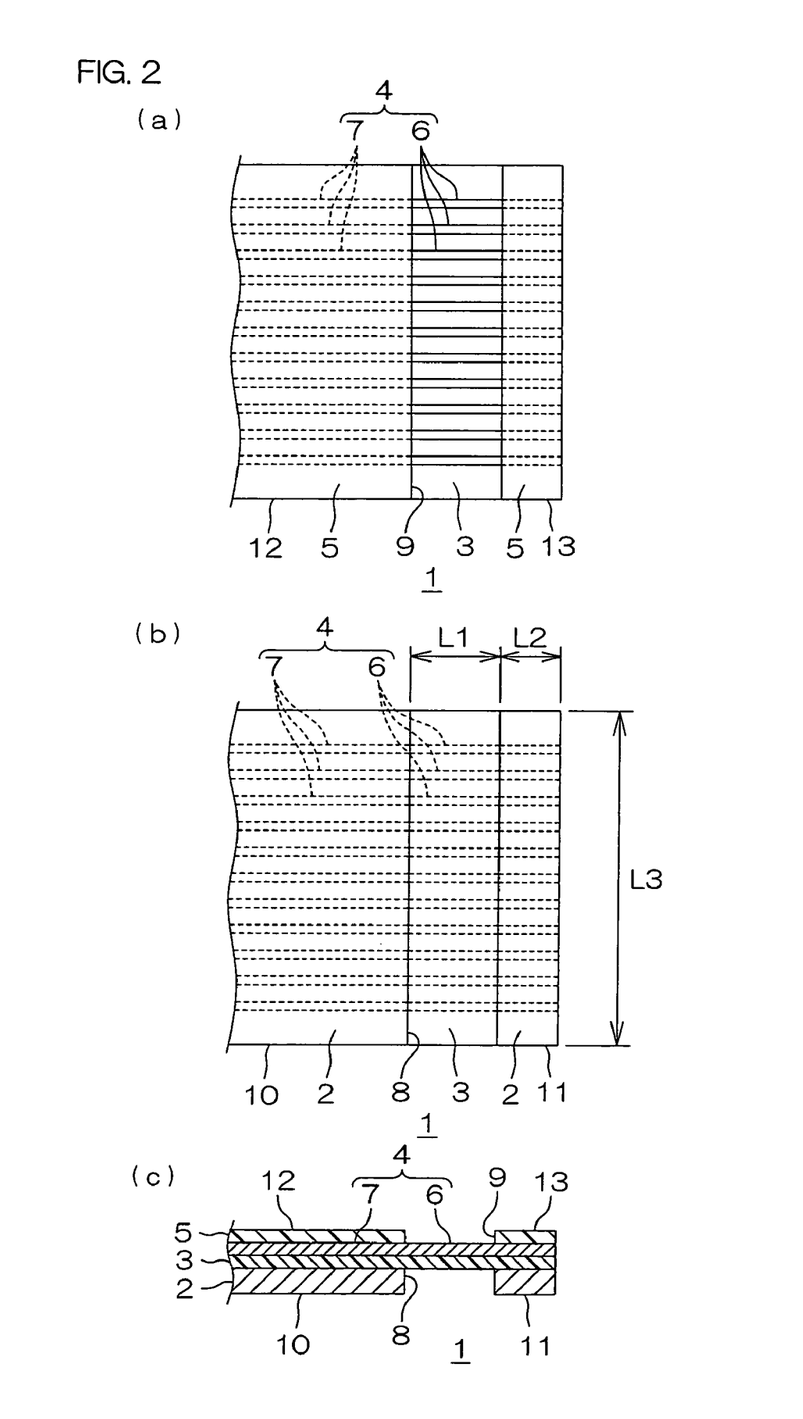
FIG. 2 is an enlarged view showing a main portion of a suspension board with circuit,
(a) showing a plan view,
(b) showing a bottom view, and
(c) showing a sectional view along the lengthwise direction thereof.
Figure 3:
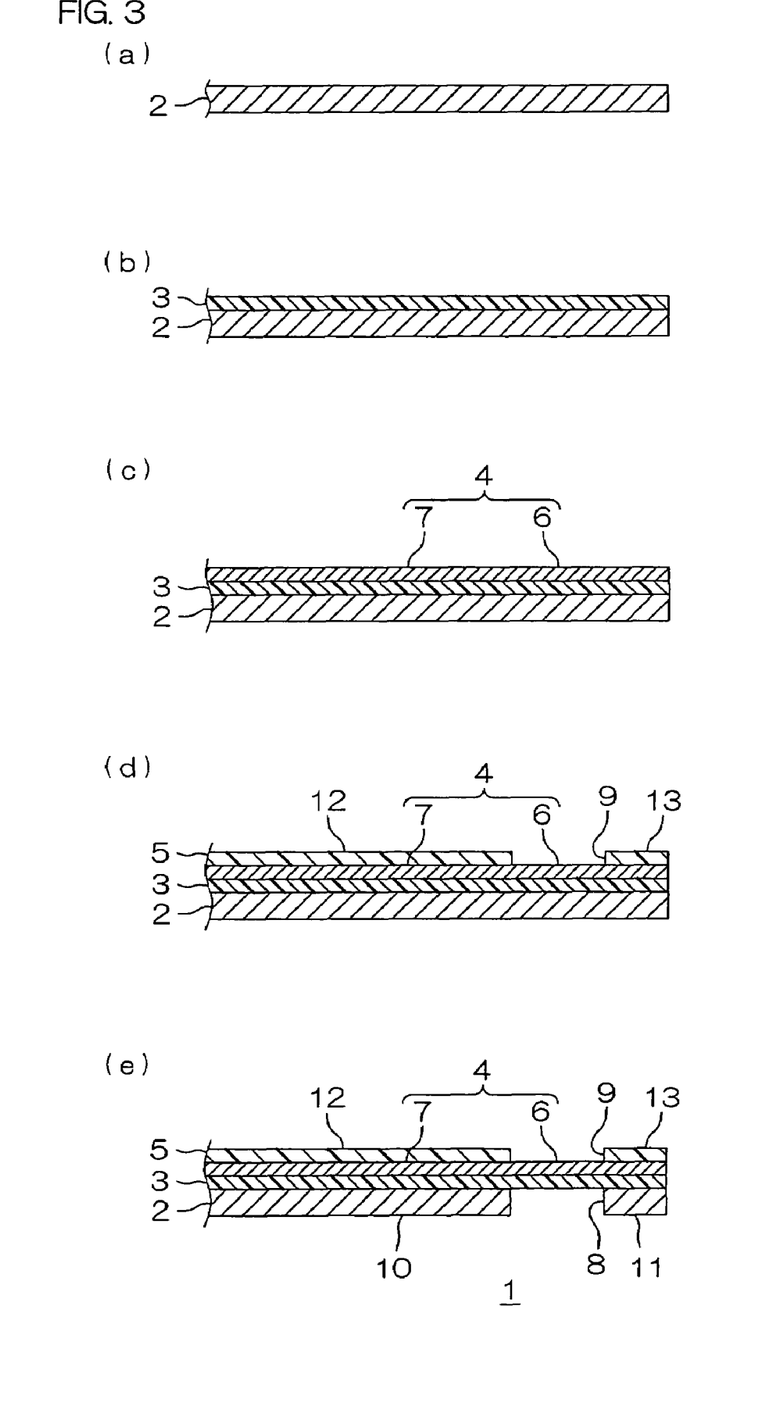
FIG. 3 is a process diagram showing a method for producing the suspension board with circuit shown in FIG. 2.
Figure 4:
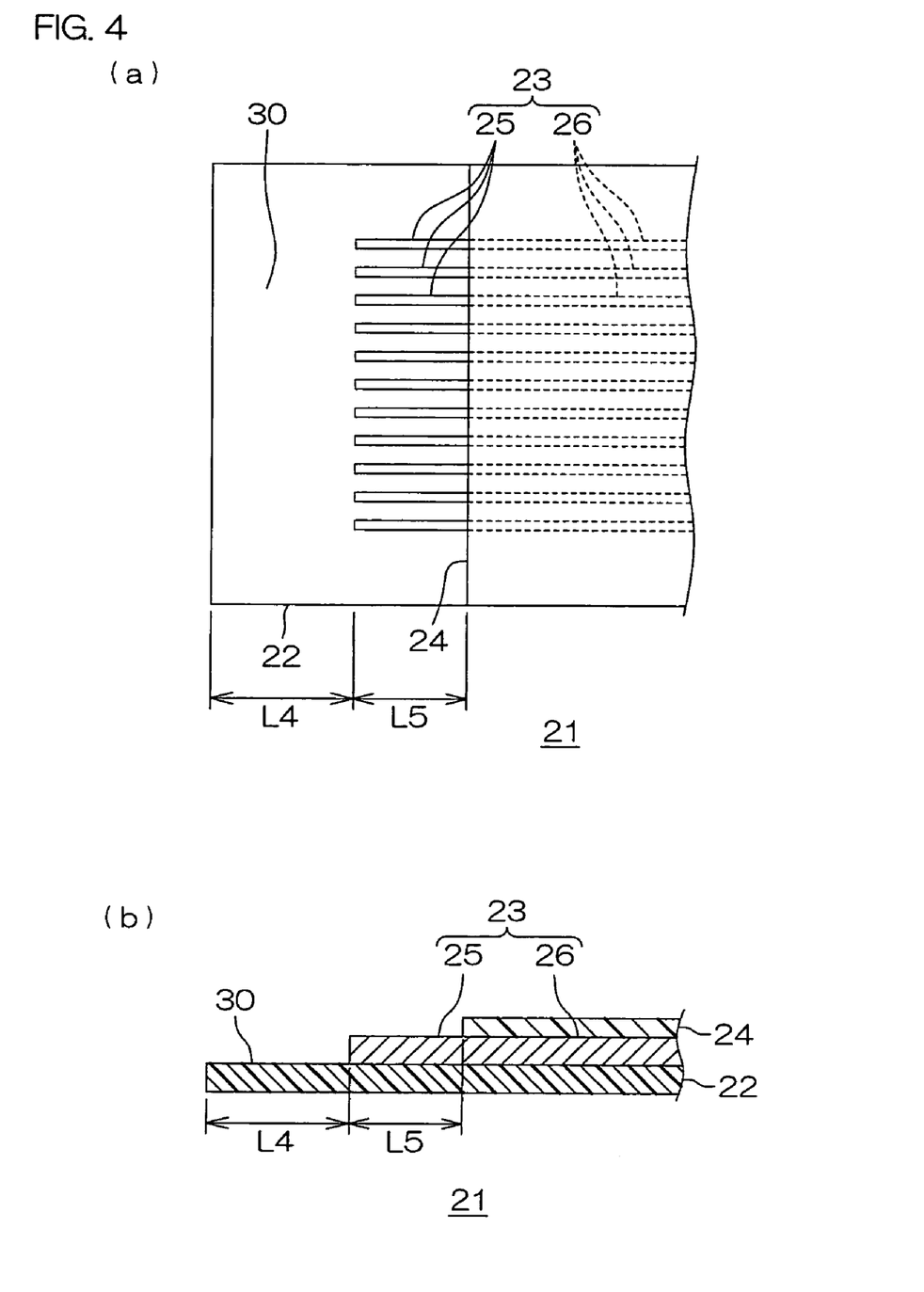
FIG. 4 is an enlarged view showing a main portion of an external wired circuit board,
(a) showing a plan view, and
(b) showing a sectional view along the lengthwise direction of the external wired circuit board.

FIG. 1 is an enlarged view showing a main portion of one embodiment of a connection structure between wired circuit boards according to the present invention, (a) showing a plan view, and (b) showing a sectional view along the lengthwise direction (the direction in which a suspension board with circuit to be mentioned later extends; the same applies hereinafter) thereof. FIG. 2 is an enlarged view showing a main portion of a suspension board with circuit, (a) showing a plan view, (b) showing a bottom view, and (c) showing a sectional view along the lengthwise direction thereof; FIG. 3 is a process diagram showing a method for producing the suspension board with circuit shown in FIG. 2; and FIG. 4 is an enlarged view showing a main portion of an external wired circuit board, (a) showing a plan view, and (b) showing a sectional view along the lengthwise direction of the external wired circuit board.

In FIG. 1, a suspension board with circuit 1 as a first wire circuit board and an external wired circuit board 21 as a second wire circuit board are electrically connected in the connection structure between wired circuit boards.

In the suspension board with circuit 1, a first conductive pattern 4 for connecting a magnetic head (not shown) of a hard disk drive and the external wired circuit board 21 is integrally formed on a metal supporting layer 2 onto which the magnetic head is mounted.

As shown in FIG. 2, the metal supporting layer 2 is formed so as to extend in the lengthwise direction of the suspension board with circuit 1.

The first conductive pattern 4 integrally includes external terminal portions 6 serving as first terminal portions arranged at the front end portion (lengthwise one end portion) of the suspension board with circuit 1, and connected to the external wired circuit board 21 (cf. FIG. 1), magnetic-head-side terminal portions, which are not shown, arranged at the rear end portion (the lengthwise other end portion) of the suspension board with circuit 1 and connected to a magnetic head, and a plurality (11 pieces) of first wires 7 lying between the external terminal portions 6 and the magnetic-head-side terminal portions for each connection therebetween.

At the front end portion of the suspension board with circuit 1, the external terminal portions 6, corresponding to the plurality (11 pieces) of wires 7, are arranged in parallel at spaced intervals to each other in the widthwise direction (the direction orthogonal to the lengthwise direction of the suspension board with circuit 1; the same applies hereinafter).

At the rear end portion of the suspension board with circuit 1, the magnetic-head-side terminal portions, which are not shown, corresponding to the plurality (11 pieces) of first wires 7, are arranged in parallel at spaced intervals to each other in the widthwise direction.

The first wires 7 are provided along the lengthwise direction and are arranged in parallel at spaced intervals to each other in the widthwise direction. The first wires 7 are each formed so as to be continuous with the respective external terminal portions 6 at the front end portion and with the respective magnetic-head-side terminal portions, which are not shown, at the rear end portion.

The suspension board with circuit 1 includes a metal supporting layer 2, a first insulating base layer 3 serving as a first insulating layer formed on the metal supporting layer 2, a first conductive pattern 4 formed on the first insulating base layer 3, and a first insulating cover layer 5 formed on the first insulating base layer 3 so as to cover the first conductive pattern 4.

The metal supporting layer 2 is formed in a generally rectangular shape in bottom view extending along the lengthwise direction, made of a metal foil or a metallic thin plate.

The metal supporting layer 2 is arranged so as not to be opposed to the external terminal portions 6 in the thickness direction. In other words, the metal supporting layer 2 is formed with a supporting-side slit 8 which is formed by opening the metal supporting layer 2 in the thickness direction, and the supporting-side slit 8 is opposed to the external terminal portions 6 in the thickness direction.

Specifically, the supporting-side slit 8 is formed along the widthwise direction so as to intersect the first conductive pattern 4. That is, the supporting-side slit 8 is formed over the entire widthwise direction from widthwise one end portion of the metal supporting layer 2 to the widthwise other end portion thereof so as to divide the metal supporting layer 2 extending in the lengthwise direction. This forms the supporting-side slit 8 so as to include all of the external terminal portions 6. The supporting-side slit 8 is formed in a constant width (length in lengthwise direction) in the widthwise direction.

The metal supporting layer 2 is thus provided so as to independently include a body support 10 having a generally rectangular shape in bottom view arranged on the rear side of the supporting-side slit 8 and a front support 11 having a generally rectangular shape in bottom view arranged on the front side of the supporting-side slit 8.

The supporting-side slit 8 has a width (length in lengthwise direction) L1 in the range of, for example, 0.5 to 5 mm, or preferably 1 to 3 mm, and the front support 11 has a width (length in lengthwise direction) L2 in the range of, for example, 100 to 500 µm, or preferably 200 to 400 µm. The front support 11 has a length (length in widthwise direction) L3 in the range of, for example, 0.1 to 3.0 mm, or preferably 0.2 to 2.6 mm.

The metal supporting layer 2 is formed of, for example, stainless steel, 42 alloys, copper and copper alloy, or preferably formed of stainless steel. The metal supporting layer 2 has a thickness in the range of, for example, 5 to 50 µm, or preferably 10 to 30 µm.

On the surface of the metal supporting layer 2, the first insulating base layer 3 is formed of a generally rectangular shape in plane view extending in the lengthwise direction so as to correspond to the outer shape of the suspension board with circuit 1.

The first insulating base layer 3 is formed of resin material such as polyimide, polyether nitrile, polyether sulfone, polyethylene terephthalate, polyethylene naphthalate, polyvinyl chloride resin, or the like, or preferably, formed of polyimide. The first insulating base layer 3 has a thickness in the range of, for example, 3 to 20 µm, or preferably 5 to 15 µm.

The first conductive pattern 4 is formed on the surface of the first insulating base layer 3, serving as a wired circuit pattern which integrally includes the plurality of first wires 7 and the external terminal portions 6 connected to the respective first wires 7 (and to the magnetic-head-side terminal portions which are not shown) as described above.

The first conductive pattern 4 is formed of metal material, such as copper, nickel, gold, solder, or alloys thereof, or preferably formed of copper. The first conductive pattern 4 has a thickness in the range of, for example, 3 to 16 µm, or preferably 6 to 13 µm.

The first wires 7 and the external terminal portions 6 each have a width (length in widthwise direction) in the range of, for example, 5 to 100 µm, or preferably 10 to 80 µm. The spacing (spacing in widthwise direction) between each of the first wires 7 and the spacing between each of the external terminal portions 6 are in the range of, for example, 5 to 150 µm, or preferably 10 to 140 µm.

The first insulating cover layer 5 is formed on the surface of the first insulating base layer 3 so as to cover the respective first wires 7 and to expose the external terminal portions 6 (and the magnetic-head-side terminal portions which are not shown). Specifically, the first insulating cover layer 5 is formed with an opening serving as a cover-side slit 9 to expose the external terminal portions 6. The cover-side slit 9 is formed at the same position as the supporting-side slit 8 in plane view.

The cover-side slit 9 thus allows the first insulating cover layer 5 to be provided so as to independently include a body cover 12 having a generally rectangular shape in plane view arranged on the rear side of the cover-side slit 9 and a front cover 13 having a generally rectangular shape in plane view arranged on the front side of the cover-side slit 9.

The first insulating cover layer 5 is formed of any of the resin materials shown by way of example for the first insulating base layer 3, or preferably formed of polyimide. The first insulating cover layer 5 has a thickness in the range of, for example, 2 to 20 μm, or preferably 4 to 17 μm.

Next, a method for producing the suspension board with circuit 1 is described with reference to FIG. 3.

In this method, a metal supporting layer 2 is first prepared, as shown in FIG. 3(*a*).

Then, a first insulating base layer 3 is formed on a surface of the metal supporting layer 2 in the above-mentioned pattern, as shown in FIG. 3(*b*).

To form the first insulating base layer 3, for example, a resin solution is coated on the surface of the metal supporting layer 2, dried, and then heated to be cured.

The resin solution is prepared by dissolving the resin mentioned above in an organic solvent or the like. As the resin solution, for example, a polyamic acid resin solution (varnish), which is a polyimide precursor, or the like may be used.

A known coating method, such as a doctor blade method or a spin coating method, is used for coating of the resin solution. The resin solution thus coated is dried appropriately by heating, and is then heated at a temperature of, for example, 250° C. or higher to be cured, so that the first insulating base layer 3 is formed on the surface of the metal supporting layer 2 in the above-mentioned pattern.

The first insulating base layer 3 can be formed as the above-mentioned pattern by blending a photosensitizer with the resin solution, coating the resin solution, exposing the coated resin solution to light, and developing it.

Alternatively, the first insulating base layer 3 can be formed by adhesively bonding a resin film preliminarily formed in the above-mentioned pattern to the metal supporting layer 2 via an adhesive agent as required.

Subsequently, in this method, a first conductive pattern 4 is formed on a surface of the first insulating base layer 3 in the above-mentioned wired circuit pattern, as shown in FIG. 3(*c*). The first conductive pattern 4 is formed by a known patterning method, such as a subtractive method or an additive method. Of these patterning methods, the additive method is preferably used from a viewpoint that the first conductive pattern 4 can be formed with a fine pitch.

Specifically, in the additive method, first, a metal thin film (not shown), such as a thin copper film or a thin chromium film, is formed on the surface of the first insulating base layer 3 by, for example, a vacuum vapor deposition method or a sputter deposition method. A plating resist is then formed in a pattern reverse to the first conductive pattern 4 on the metal thin film, and the first conductive pattern 4 is formed on the surface of the metal thin film exposed from the plating resist by electrolytic plating. Thereafter, the plating resist and the metal thin film in a portion on which the plating resist is formed are removed by etching or peeling.

This forms the first conductive pattern 4 in the wired circuit pattern described above.

Then, in this method, as shown in FIG. 3(*d*), the first insulating cover layer 5 is formed so as to cover each of the first wires 7 and so as to expose the external terminal portions 6 (and the magnetic-head-side terminal portions which are not shown).

To form the first insulating cover layer 5, for example, a resin solution, or preferably a polyamic acid resin solution is coated on the surface of the first insulating base layer 3, dried, and then heated to be cured in the same manner as in the formation of the first insulating base layer 3. Then, the first insulating cover layer 5 is opened by etching or laser processing to form the cover-side slit 9.

The first insulating cover layer 5 can be formed as the above-mentioned pattern by blending a photosensitizer with the resin solution, coating the resin solution, exposing the coated resin solution to light, and developing it in the same manner as in the formation of the first insulating base layer 3.

Alternatively, the first insulating cover layer 5 can be formed by adhesively bonding a resin film preliminarily formed in the above-mentioned pattern to the surface of the first insulating base layer 3 via an adhesive agent as required.

This forms the first insulating cover layer 5 which includes the body cover 12 and the front cover 13 and is formed with the cover-side slit 9 exposing the external terminal portions 6.

Thereafter, in this method, as shown in FIG. 3(*e*), the supporting-side slit 8 is formed.

To form the supporting-side slit 8, an opening is formed by, for example, etching (e.g., wet etching) or laser processing, or preferably by wet etching.

To perform wet etching, first, the metal supporting layer 2 in a portion other than those where the supporting-side slit 8 is formed is covered with etching resist. Subsequently, the metal supporting layer 2 exposed from the etching resist is removed using a known etching solution such as a ferric chloride solution. Thereafter, the etching resist is removed.

Thereafter, though not shown, a metal plating layer is formed as required on the external terminal portions 6 and on the magnetic-head-side terminal portions which are not shown, both of which are exposed from the first insulating cover layer 5 to thereby obtain the suspension board with circuit 1. The metal plating layer may be formed by, for example, electrolytic plating (e.g., electrolytic gold plating or electrolytic nickel plating).

In FIGS. 1 and 4, the external wired circuit board 21 is a relay flexible board electrically connected to the suspension board with circuit 1, or a control flexible board. The external wired circuit board 21 includes a second insulating base layer 22 serving as a second insulating layer, a second conductive pattern 23 formed on the second insulating base layer 22, and a second insulating cover layer 24 formed on the first insulating base layer 3 so as to cover the second conductive pattern 23.

The second insulating base layer 22 is formed of a flat plate having a generally rectangular shape in plane view which is wider than the first insulating base layer 3 and extends along the lengthwise direction. For example, the second insulating base layer 22 is formed of any of the resin materials shown by way of example for the first insulating base layer 3, or preferably formed of polyimide. In addition, the second insulating base layer 22 has a thickness in the range of, for example, 8 to 50 μm, or preferably 10 to 40 μm.

The second conductive pattern 23 is formed on the surface of the second insulating base layer 22 and includes a plurality (11 pieces) of second wires 26 and connecting terminal portions 25 serving as the second terminal portions corresponding to the respective second wires 26. The second conductive pattern 23 includes terminal portions for connecting with various electronic components and various wired circuit boards on the side lengthwisely opposite to the respective connecting terminal portions 25, though they are not shown.

The second wires 26 are each provided along the lengthwise direction and are arranged in parallel at spaced intervals to each other in the widthwise direction. The second wires 26 are formed so as to be continuous with the respective connecting terminal portions 25 at the rear end portion (lengthwise one end portion).

At the rear end portion of the second insulating base layer 22, the connecting terminal portions 25 are provided at spaced intervals to each other along the widthwise direction and continuously extend rearward from the respective second wires 26. The rear end edge of each of the connecting terminal portions 25 is arranged on the front side of the rear end edge of the second insulating base layer 22 in the lengthwise direction so that the surface of the rear end portion of the second insulating base layer 22 is exposed. Thus, an area between the rear end edges of the connecting terminal portions 25 and the rear end edge of the second insulating base layer 22 is designated as a placement region 30 on which the front cover 13 of the first insulating cover layer 5 is placed.

The placement region 30 has a length (length in lengthwise direction) L4 in the range of, for example, 0.1 to 4 mm, or preferably 0.2 to 3 mm.

The second conductive pattern 23 is formed of any of the metal materials shown by way of example for the first conductive pattern 4, or preferably formed of copper. The second conductive pattern 23 has a thickness in the range of, for example, 3 to 40 μm, or preferably 6 to 30 μm.

The connecting terminal portions 25 are each provided corresponding to the respective external terminal portions 6 and are formed so as to have widths and spacings therebetween which allow to the connecting terminal portions 25 to face the respective external terminal portions 6 in the lengthwise direction.

Specifically, the second wires 26 and the connecting terminal portions 25 each have a width in the range of, for example, 20 to 200 μm, or preferably 30 to 150 μm. The spacing (spacing in widthwise direction) between each of the second wires 26 and the spacing between each of the connecting terminal portions 25 are in the range of, for example, 20 to 150 μm, or preferably 30 to 100 μm.

Each of the connecting terminal portions 25 has a length (length in lengthwise direction from the rear end edge of the second insulating cover layer 24 to be described later to the rear end edge of the connecting terminal portion 25) L5 in the range of, for example, 0.5 to 5 mm, or preferably 0.2 to 2 mm.

The second insulating cover layer 24 is formed on the surface of the second insulating base layer 22 so as to cover the respective second wires 26 and to expose the connecting terminal portions 25. The rear end edge of the second insulating cover layer 24 is arranged on the front side of the connecting terminal portions 25 to expose the respective connecting terminal portions 25 and the placement region 30, and linearly intersects the second conductive pattern 23 along the widthwise direction.

This arranges the rear end edge of the second insulating cover layer 24, the rear end edges of the respective connecting terminal portions 25, and the rear end edge of the second insulating base layer 22 in this order rearward at spaced intervals to each other in the lengthwise direction. In other words, the rear end portion of the external wired circuit board 21 is formed in a stepwise shape as viewed in section such that the number of steps formed with the rear end edge of the second insulating cover layer 24, the rear end edges of the respective connecting terminal portions 25 and the rear end edge of the second insulating base layer 22 decreases toward the rear side.

The second insulating cover layer 24 is formed of any of the resin materials shown by way of example for the first insulating base layer 3, or preferably formed of polyimide. The second insulating cover layer 24 has a thickness in the range of, for example, 5 to 35 μm, or preferably 7 to 20 μm.

The external wired circuit board 21 is formed according to the above-mentioned method for producing the suspension board with circuit 1 or according to a known method.

To electrically connect between the suspension board with circuit 1 and the external wired circuit board 21, first, in the suspension board with circuit 1, each of the external terminal portions 6 is folded back at 180° into a curved shape (into a U-shape) so that the external terminal portions 6 are folded into a mountain-shape, as shown in FIG. 1. This arranges the front end portion of the body support 10 and the front support 11 in opposed relation to each other in the thickness direction while the external terminal portions 6 are exposed toward the front side of the body support 10.

Subsequently, the front cover 13 of the first insulating cover layer 5 is placed on the placement region 30, and at the same time, the external terminal portions 6 are abutted against the respective rear end portions of the connecting terminal portions 25, more specifically, the external terminal portions 6 thus folded are abutted against the respective rear end edges (ridgeline formed between the rear end face and the upper surface) of the connecting terminal portions 25.

Solder balls 31 serving as molten metal are then provided by heating the solder balls 31 to be molten so as to come into contact with the surfaces of the respective external terminal portions 6 and the upper surfaces of the rear end portions of the respective connecting terminal portions 25.

In the connection structure between wired circuit boards, each of the external terminal portions 6 of the suspension board with circuit 1 is folded back into a curved shape, so that the external terminal portions 6 and the connecting terminal portions 25 of the external wired circuit board 21 are each arranged in opposed relation in the lengthwise direction, and the surfaces of the external terminal portions 6 and the rear end portions of the connecting terminal portions 25 are in contact with each other while abutted against each other.

Thus, in the connection structure between wired circuit boards, the respective external terminal portions 6 of the suspension board with circuit 1 are electrically connected to the respective connecting terminal portions 25 of the external wired circuit board 21 via the solder balls 31.

Since the external terminal portions 6 is folded back into a curved shape, good visibility can be ensured from above, specifically from obliquely upper front side as indicated by the dashed-line arrow, in connection between the external terminal portions 6 and the connecting terminal portions 25.

Further, since the first conductive pattern 4 is supported on the first insulating base layer 3, the mechanical strength in the first conductive pattern 4 can be reinforced.

Yet further, since the external terminal portions 6 are not supported on the metal supporting layer 2, the curved shape in each of the external terminal portions 6 can be reliably secured.

Still further, in the connection structure, even when a restoring force is exerted on the external terminal portions 6 formed into a curved shape, the restoring force acts so that the external terminal portions 6 move in a direction to come into pressure contact with the connecting terminal portions 25, that is, the external terminal portions 6 move toward the front side. Therefore, even in such case, the connection reliability between the external terminal portions 6 and the connecting terminal portions 25 can be improved.

Figure 5:
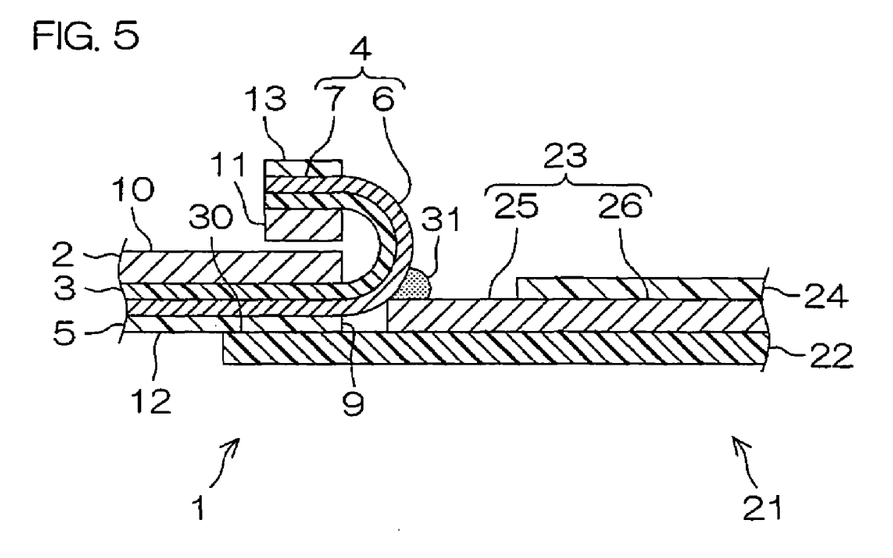
FIG. 5 is an enlarged view showing a main portion of another embodiment of a connection structure between wired circuit boards according to the present invention, and is a sectional view along the lengthwise direction of an external wired circuit board.

FIG. 5 is an enlarged sectional view along the lengthwise direction of an external wired circuit board, showing a main portion of another embodiment of a connection structure between wired circuit boards according to the present invention. The same reference numerals are used in FIG. 5 for the same members as those described above, and the description thereof is omitted.

In the above description, although, in the connection between the suspension board with circuit 1 and the external wired circuit board 21, the front cover portion 13 of the suspension board with circuit 1 is placed on the placement region 30, this placement is not limited thereto, and the front end portion of the body cover 12 may be placed on the placement region 30 by turning the suspension board with circuit 1 formed in a curved shape upside down, as shown in FIG. 5.

In the connection structure between wired circuit boards, the front cover 13 and the front support 11 that are not placed on the placement region 30 are compact and lightweight as compared with the body cover 12 and the body support 10, so that the restoring force may be more strongly exerted on the external terminal portions 6. This can further improve the connection reliability between the external terminal portions 6 and the connecting terminal portions 25.

In the above description, although the first wired circuit board is explained as the suspension board with circuit 1, the first wired circuit board is not limited thereto, and various wired circuit boards, such as a flexible wired circuit board or a rigid wired circuit board, may be included.

In the above description, the supporting-side slit 8 is formed in the entire widthwise direction from widthwise one end portion of the metal supporting layer 2 to the widthwise other end portion thereof so as to divide the metal supporting layer 2. However, the supporting-side slit 8 may be formed so as to preserve widthwise one end portion and/or the widthwise other end portion of the metal supporting layer 2 without dividing the metal supporting layer 2.

Preferably, from a viewpoint of easily folding back the external terminal portions 6, the supporting-side slit 8 is entirely formed in the widthwise direction so as to divide the metal supporting layer 2.

EXAMPLES

While in the following, the present invention is described in further detail with reference to Examples, the present invention is not limited to any of them by no means.

Example 1

Formation of Suspension Board with Circuit

A metal supporting layer made of stainless steel foil having a width of 2.1 mm and a thickness of 20 μm was prepared (cf. FIG. 3(a)). Subsequently, a photosensitive polyamic acid resin solution (varnish) was coated on the surface of the metal supporting layer and then dried. The coated resin was exposed to light via a photomask, heated after the exposure, developed using an alkaline developer, and heated to be cured, thereby forming a first insulating base layer made of polyimide having a thickness of 10 μm (cf. FIG. 3(b)).

Next, a thin chromium film having a thickness of 30 nm and a thin copper film having a thickness of 70 nm were sequentially formed over the entire first insulating base layer by sputter deposition method, thereby forming a metal thin film.

A plating resist was then formed in a pattern reverse to the first conductive pattern on the metal thin film, and thereafter a first conductive pattern having a thickness of 10 μm was formed on the metal thin film exposed from the plating resist by electrolytic copper plating as a wired circuit pattern including first wires, and external terminal portions and magnetic-head-side terminal portions (cf. FIG. 3(c)). Subsequently, the plating resist was removed by wet etching, and the portion of the metal thin film on which the plating resist was formed was then removed by peeling them off.

Each of the external terminal portions had a length of 2 mm. The external terminal portions and the first wires each had a width of 60 μm, and the spacing between each of the external terminal portions and the spacing between each of the first wires were 120 μm.

Subsequently, a photosensitive polyamic acid resin solution (varnish) was coated on the surface of the first insulating base layer and then dried. The coated resin was exposed to light via a photomask, developed using an alkaline developer, and heated to be cured, thereby forming a first insulating cover layer made of polyimide having a thickness of 5 μm (cf. FIG. 3(d)).

The first insulating cover layer was formed as a pattern in which the respective external terminal portions were exposed at the front end portion thereof and the magnetic-head-side terminal portions were exposed at the rear end portion thereof. The first insulating cover layer was formed with a cover-side slit. The cover-side slit had a width (length in lengthwise direction) of 2 mm while the front cover had a width (length in lengthwise direction) of 250 μm.

Next, the metal supporting layer was opened by wet etching using a ferric chloride solution, thereby forming a supporting-side slit in the same size as the cover-side slit.

Thereafter, the external terminal portions and the magnetic-head-side terminal portions were sequentially subjected to electroless nickel plating and electroless gold plating, thereby forming a metal plating layer having a thickness of 2 μm made of a nickel plating layer and a gold plating layer to obtain a suspension board with circuit.

(Connection Between Suspension Board with Circuit and External Circuit Board)

An external wired circuit board was prepared including a second insulating base layer (2.5 mm in width) made of polyimide having a thickness of 25 μm, a second conductive pattern (1 mm in length, 100 μm in width, and 80 μm in spacing of each connecting terminal portion) formed on the second insulating base layer and made of 1 copper foil having a thickness of 18 μm, and a second insulating cover layer made of polyimide having a thickness of 5 μm, formed on the second insulating base layer so as to cover the second conductive pattern and to expose each of the connecting terminal portions. The rear end edges of the connecting terminal portions were arranged on the front side of the rear end edge of the second insulating base layer so that the surface of the rear end portion of the second insulating base layer was exposed, thereby securing a placement region having a length in lengthwise direction of 2 mm on the second insulating base layer.

In the suspension board with circuit, each of the external terminal portions was folded back at 180° into a curved shape so that the external terminal portions were folded into a mountain-shape. Subsequently, the front cover of the first insulating cover layer was placed on the placement region of the second insulating base layer, and at the same time, the external terminal portions were abutted against the respective rear end portions of the connecting terminal portions. Thereafter, molten solder balls were brought into contact with both the surfaces of the respective external terminal portions and the upper surfaces of the rear end portions of the respective connecting terminal portions.

This allowed the suspension board with circuit and the external wired circuit board to be electrically connected to each other (cf. FIG. 1).

Example 2

The suspension board with circuit and the external wired circuit board were electrically connected in the same manner as in Example 1 except that the suspension board with circuit of Example 1 was turned upside down and the front end portion of the body cover of the first insulating cover layer was then placed on the placement region of the second insulating base layer (cf. FIG. 5).

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A connection structure between wired circuit boards connecting a first wired circuit board and a second wired circuit board, the first wired circuit board comprising:
a metal supporting layer;
a first insulating layer formed on the metal supporting layer; and
a first conductive pattern formed on the first insulating layer and having a first terminal portion, wherein
the metal supporting layer is arranged so as not to be opposed to the first terminal portion in a thickness direction, and
the first terminal portion and the first insulating layer opposed to the first terminal portion in a thickness direction are folded back into a curved shape,
the second wired circuit board comprising:
a second insulating layer; and
a second conductive pattern formed on the second insulating layer and having a second terminal portion, wherein
the first terminal portion and the second terminal portion are electrically connected to each other.

2. The connection structure between wired circuit boards according to claim 1, wherein the first terminal portion and the second terminal portion are connected to each other via a molten metal.

3. The connection structure between wired circuit boards according to claim 1, wherein the first wired circuit board is a suspension board with circuit.

* * * * *